US012563689B1

(12) United States Patent

Naderi

(10) Patent No.: US 12,563,689 B1

(45) Date of Patent: Feb. 24, 2026

(54) POWER DISTRIBUTION UNIT

(71) Applicant: Nvidia Corporation, Santa Clara, CA (US)

(72) Inventor: Alex R. Naderi, Santa Clara, CA (US)

(73) Assignee: NVIDIA Corporation, Santa Clara, CA (US)

( * ) Notice: Subject to any disclaimer, the term of this patent is extended or adjusted under 35 U.S.C. 154(b) by 304 days.

(21) Appl. No.: 16/798,790

(22) Filed: Feb. 24, 2020

(51) Int. Cl.
*H05K 7/00* (2006.01)
*G06F 1/18* (2006.01)
*H05K 7/14* (2006.01)

(52) U.S. Cl.
CPC ........... *H05K 7/1457* (2013.01); *G06F 1/189* (2013.01)

(58) Field of Classification Search
CPC .............................. H05K 7/1457; G06F 1/189
See application file for complete search history.

(56) References Cited

U.S. PATENT DOCUMENTS

| | | | | | |
|---|---|---|---|---|---|
| 6,826,036 | B2 * | 11/2004 | Pereira | ................. | H05K 7/1457 |
| | | | | | 361/624 |
| 7,268,998 | B2 * | 9/2007 | Ewing | .................. | H05K 7/1492 |
| | | | | | 174/59 |
| 8,697,990 | B2 * | 4/2014 | Moore | ................... | H01R 29/00 |
| | | | | | 361/600 |
| 10,512,194 | B1 * | 12/2019 | Marrs | ................. | H05K 7/20727 |
| 10,932,388 | B1 * | 2/2021 | Davis | ...................... | G06F 1/188 |
| 2001/0026436 | A1 * | 10/2001 | Tanzer | ................. | H01R 25/006 |
| | | | | | 361/725 |
| 2008/0012423 | A1 * | 1/2008 | Mimran | ............... | H01R 31/065 |
| | | | | | 307/11 |
| 2015/0189787 | A1 * | 7/2015 | Bailey | ................ | H05K 7/20736 |
| | | | | | 361/679.48 |
| 2019/0020161 | A1 * | 1/2019 | Irons | .................... | H01R 13/645 |
| 2019/0037724 | A1 * | 1/2019 | Franz | .................. | H05K 7/1457 |
| 2022/0043686 | A1 * | 2/2022 | Stuntebeck | ........ | G06K 19/0723 |

* cited by examiner

*Primary Examiner* — Pete T Lee

(57) ABSTRACT

Provided is a power distribution unit and a server system. The power distribution unit, in one aspect, includes a power distribution unit enclosure having a connector surface. The power distribution unit, according to this aspect, further includes one or more low power inlet connectors extending through the connector surface, and one or more higher power inlet connectors extending through the connector surface. In accordance with this aspect, a ratio of a number of the one or more higher power inlet connectors to a number of the one or more low power inlet connectors is at least 1:1.

43 Claims, 6 Drawing Sheets

POWER DISTRIBUTION UNIT

TECHNICAL FIELD

This disclosure is directed, in general, to data centers and, more specifically, to designing and employing power distribution units configured for use in higher power applications.

BACKGROUND

Many organizations use large scale computing facilities, such as data centers, in their business. These data centers traditionally include rooms full of dozens of server racks, each server rack housing different electronic components, including servers, network equipment, and computer equipment necessary to process, store, and exchange data as needed to carry out an organization's operations. Each server rack typically includes one or more power distribution units for the distribution of power to the electronic components located therein. Unfortunately, today's power distribution units are not designed to handle the ever increasing power demand of the electronic components located within the server racks.

BRIEF DESCRIPTION

Figure 3:
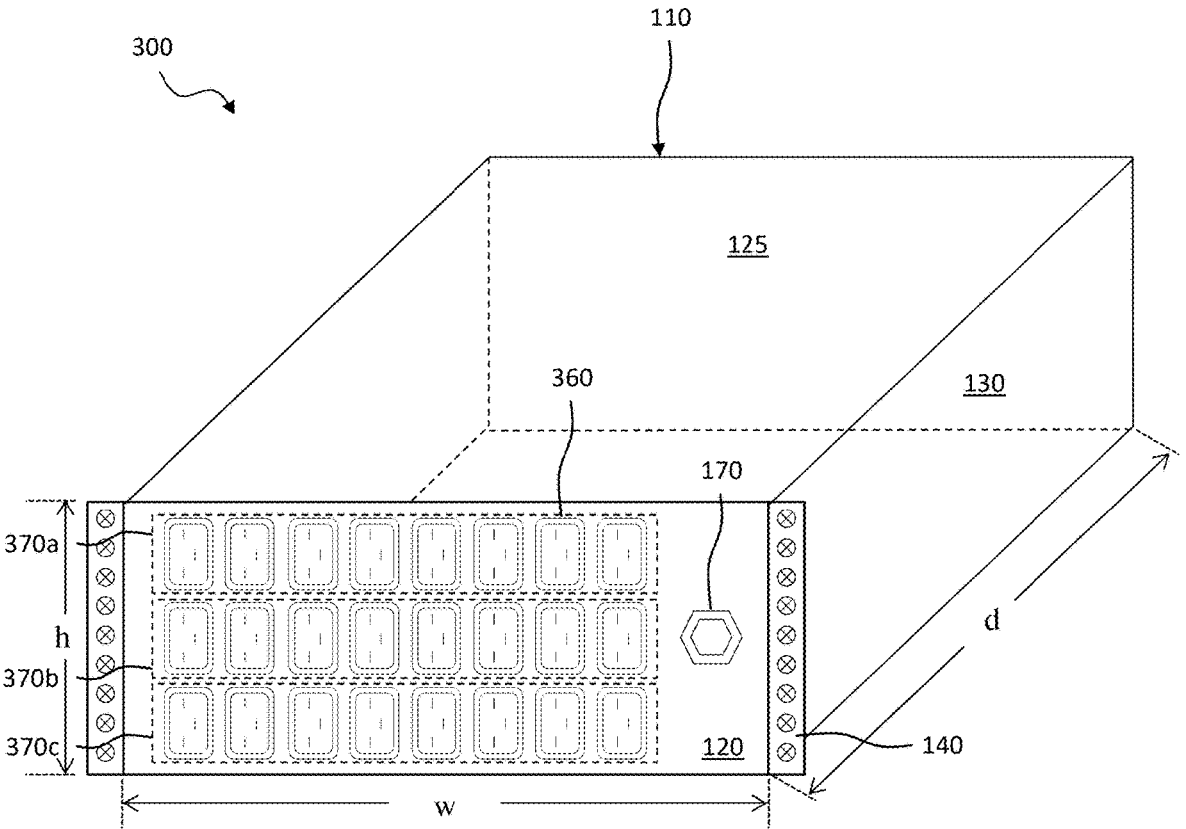
Figure 4:
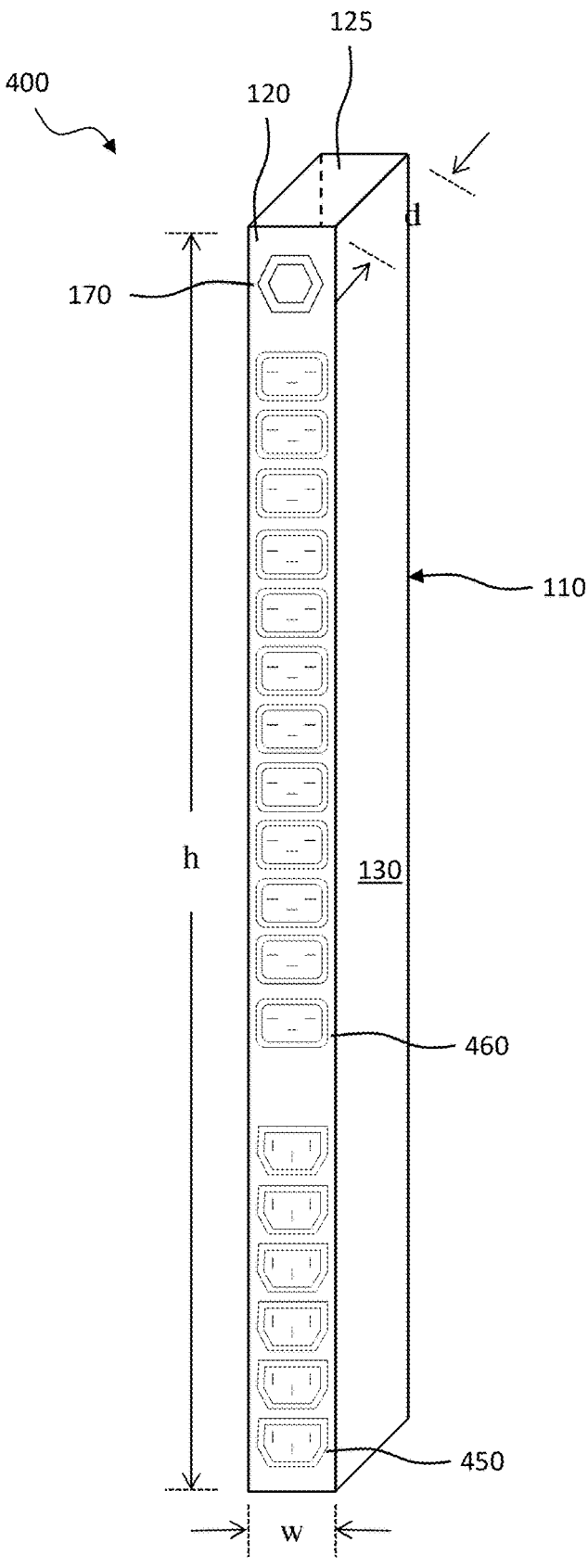
Figure 5:
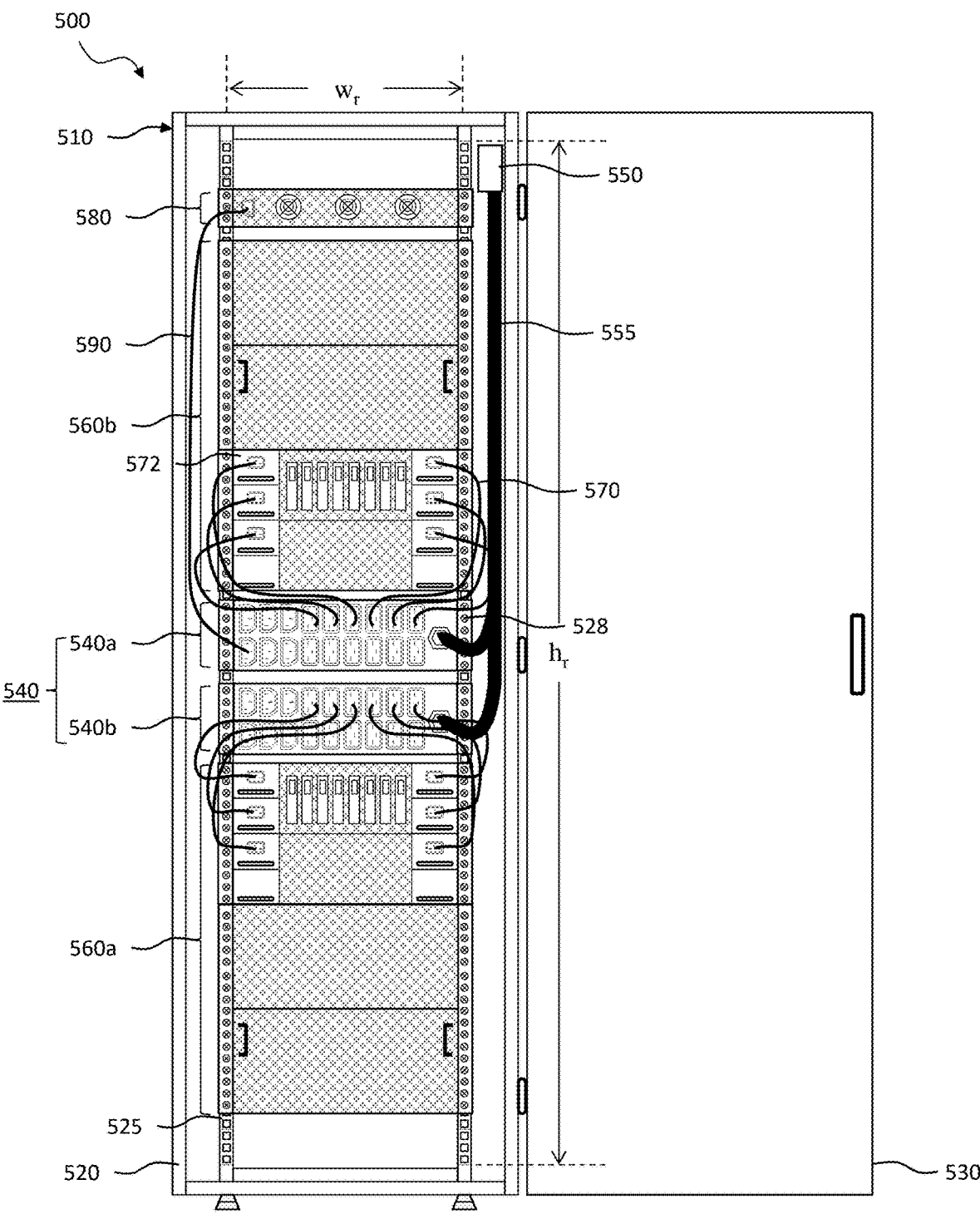
Figure 6:
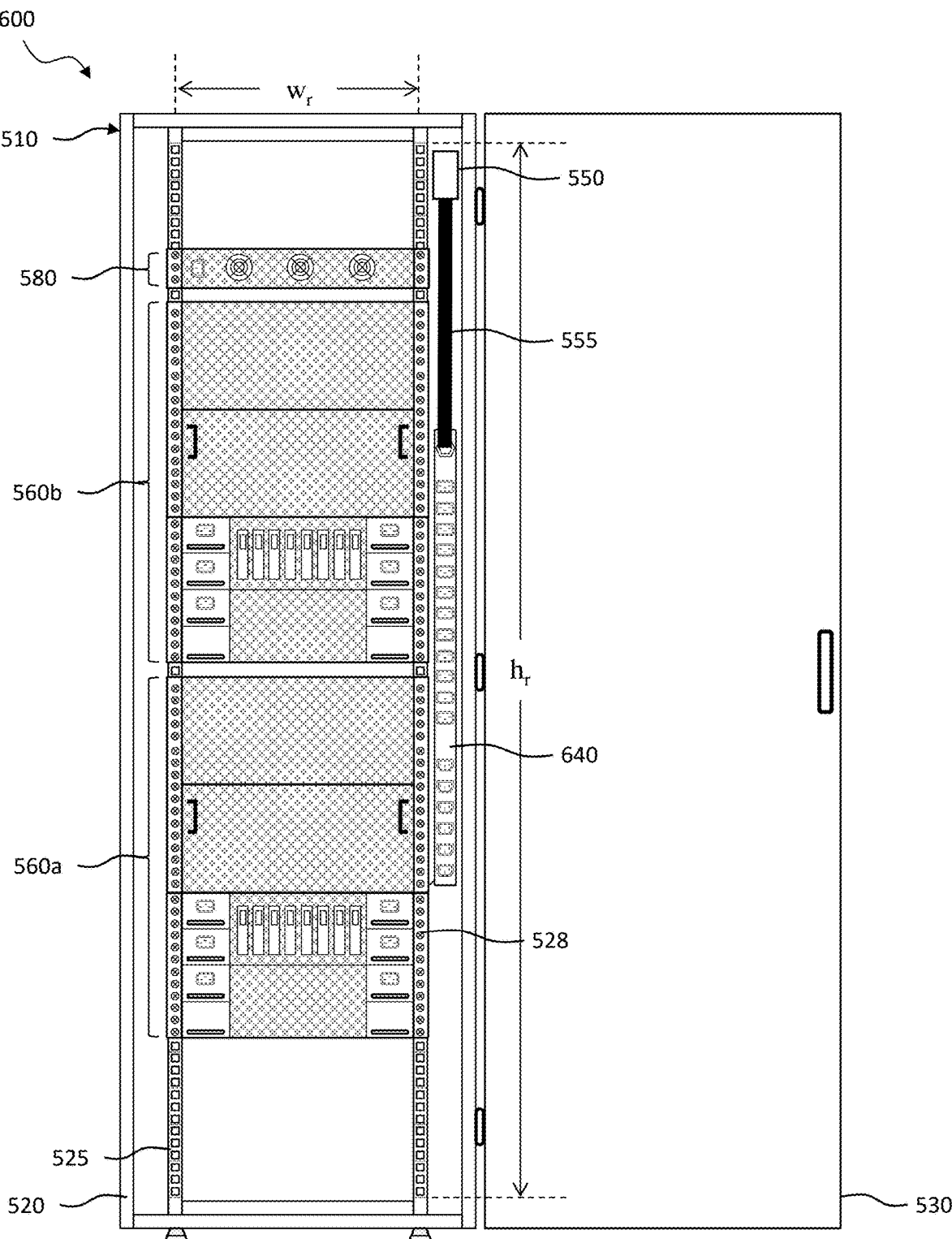

Reference is now made to the following descriptions taken in conjunction with the accompanying drawings, in which:

FIGS. 1-4 illustrate power distribution units (PDUs) designed, manufactured and operated according to one or more alternative embodiments of the disclosure; and FIGS. 5-6 illustrate server systems designed, manufactured and operated according to one or more alternative embodiments of the disclosure.

DETAILED DESCRIPTION

In at least one embodiment, demand for more power from power distribution units, is due in part to the desire for data centers to provide the Floating Point Operations per Second (FLOPS) needed for high performance computing, such as may be necessary for artificial intelligence (AI) applications. In at least one embodiment, data centers can be used to provide the storage and networking needed to support large-scale deep neural network (DNN) training that powers software development for autonomous vehicles, internal AI for companies, and robotics development, among others. In at least one embodiment, the data centers can be used with reactive machines, autonomous machines, self-aware machines, and self-learning machines that all require a massive compute intensive server infrastructure and computing power. In at least one embodiment, in addition to an increase in computing power, the desire for data centers to provide more computing power in less physical space can also increase the power demand placed on power distribution units.

In at least one embodiment, the server systems needed for data centers to provide the amount of computing power being requested require a tremendous amount of power. In at least one embodiment, while low-power power distribution units may be sufficient for server racks having a power demand up to approximately 15 kVA, server racks having a higher power demand require power distribution units capable of providing more power. In at least one embodiment, this disclosure provides a novel power distribution unit capable of handling the higher power demands encountered with some server systems, regardless of processor type located therein.

In at least one embodiment, the server systems can include various types of electronic components requiring power, such as one or more processors. In at least one embodiment, the processors can be parallel processing units, such as graphics processing units (GPUs), or serial processing units, such as central processing units (CPUs). In at least one embodiment, the processors can also be other types of circuits having at least a portion of the processing capabilities of a GPU or CPU. In at least one embodiment, the processors can be, for example, application-specific integrated circuits (ASICs), digital signal processors (DSPs), or programmable logic devices such as programmable array logic (PAL), generic array logic (GAL), field programmable gate arrays (FPGA), or another type of computer processing device (CPD). In at least one embodiment, server systems can include a single type of processor or a combination of any of different types of processors. In at least one embodiment, the server systems can include an analog processor.

In at least one embodiment, the server systems can be high-density (HD) GPU racks that include storage nodes and high performance GPU compute nodes designed to accelerate deep learning applications. In at least one embodiment, the high performance GPU compute nodes can be servers designed for general-purpose computing on graphics processing units (GPGPU) to accelerate deep learning applications. In at least one embodiment, the GPU compute nodes can be servers of the DGX or EGX product lines from NVIDIA Corporation of Santa Clara, California. In at least one embodiment, a version of the DGX product line, DGX-2, is used herein as one example of a GPU compute node.

Figure 1:
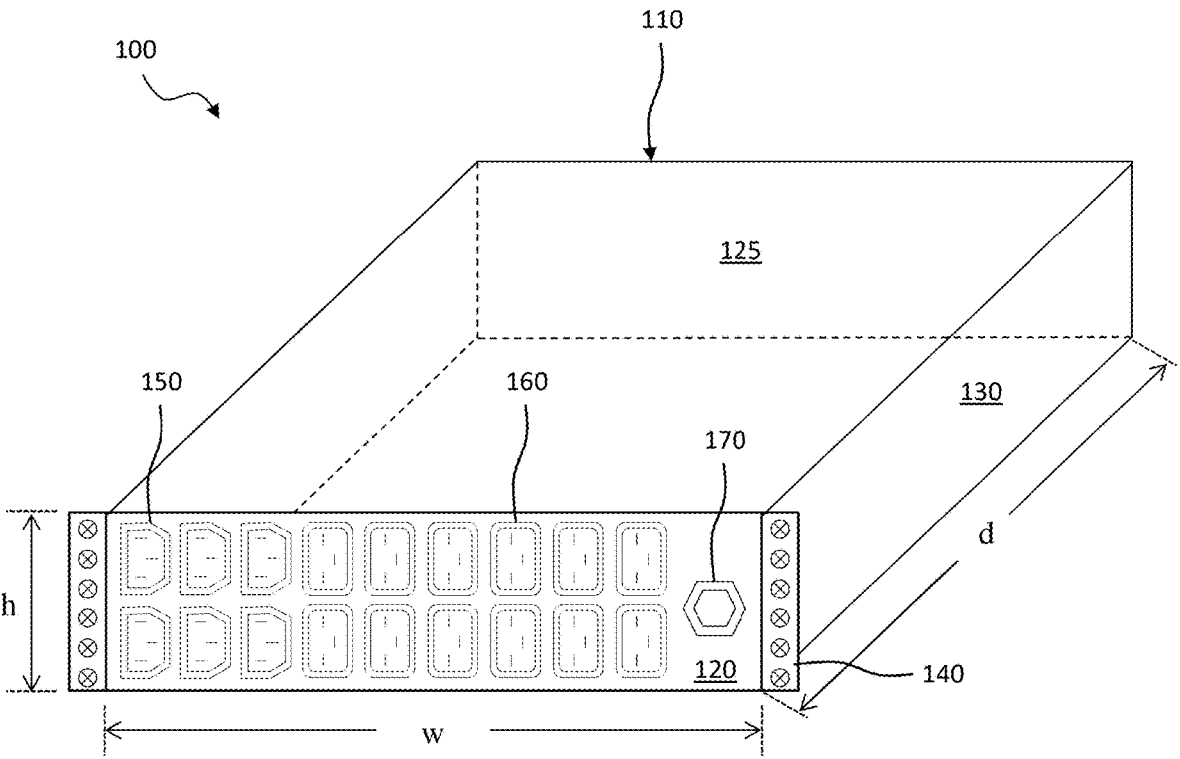

In at least one embodiment, FIG. 1 illustrates a power distribution unit 100 designed, manufactured and operated according to the disclosure. In at least one embodiment, the power distribution unit 100 includes a power distribution unit enclosure 110. In at least one embodiment, the power distribution unit enclosure 110 includes a connector surface 120, a rear surface 125, and one or more side surfaces 130. In at least one embodiment, the connector surface 120 and rear surface 125 are defined by the width (w) and height (h), whereas the one or more side surfaces are defined by the height (h) and depth (d).

In at least one embodiment, the width (w), height (h) and depth (d) of the power distribution unit enclosure 110 may vary based upon the design of the power distribution unit 100. In at least one embodiment, nevertheless, the width (w) of the power distribution unit enclosure 110 ranges from approximately 405 mm (e.g., approximately 16 inches) to approximately 445 mm (e.g., approximately 17.5 inches), as might be used with an approximately 483 mm (e.g., approximately 19 inch) server rack system. In at least one embodiment, the width (w) of the power distribution unit enclosure 110 ranges from approximately 508 mm (e.g., approximately 20 inches) to approximately 545 mm (e.g., approximately 21.5 inches), as might be used with an approximately 584 mm (e.g., approximately 23 inch) server rack system. In at least one embodiment, such widths (w) are consistent with rack widths ($w_r$) of certain standard server rack systems. In at least one embodiment, various different spacers and rack mount ears may also be used to accommodate different power distribution unit 100 widths (w).

In at least one embodiment, the height (h) of the power distribution unit enclosure 110 illustrated in FIG. 1 is described based upon a number of rack units (U). In at least one embodiment, a rack unit (U), as that term is used in the present disclosure, is equal to approximately 44.5 mm (e.g., approximately 1.75 inches). In at least one embodiment, a 1 U height (h) is equal to approximately 44.5 mm (e.g., approximately 1.75 inches), a 2 U height (h) is equal to approximately 89 mm (e.g., approximately 3.5 inches), a 3 U height (h) is equal to approximately 133.5 mm (e.g., approximately 5.25 inches), etc. In at least one embodiment, including the illustrated embodiment of FIG. 1, the power distribution unit enclosure 110 has a 2 U height (h).

In at least one embodiment, the depth (d) of the power distribution unit enclosure 110 illustrated in FIG. 1 is based upon the size of the internal components that make up the power distribution unit 100. In at least one embodiment, the depth (d) of the power distribution unit enclosure 110 is generally less than the rack depth (d$_r$) of the server rack system it is housed within, and thus in at least one embodiment less than approximately 1016 mm (e.g., approximately 40 inches), or less than approximately 915 mm (e.g., approximately 36 inches), depending on the server rack system chosen. In at least one embodiment, including the embodiment of FIG. 1, the width (w) and depth (d) are each greater than the height (h).

In at least one embodiment, rack mount ears 140 are coupled to the power distribution unit enclosure 110. In at least one embodiment, the rack mount ears 140 may include a collection of appropriately spaced holes, which align with same spaced holes in a rail system of a server rack system, for coupling the power distribution unit 100 to the server rack system. In at least one embodiment, the rack mount ears 140 may be removably coupled to the power distribution unit enclosure 110, such as shown in FIG. 1. In at least one embodiment, the rack mount ears 140 may alternatively be fixedly coupled to the power distribution unit enclosure 110. In at least one embodiment, including the embodiment of FIG. 1, the power distribution unit enclosure 110 is a 2 U rack mount power distribution unit enclosure.

In at least one embodiment, including the illustrated embodiment of FIG. 1, the power distribution unit 100 includes one or more low power inlet connectors 150 and one or more higher power inlet connectors 160, each extending through the connector surface 120. In at least one embodiment, the phrases "low power" and "higher power," as used herein with respect to the connectors, are relative terms based upon their maximum current carrying capacity. In at least one embodiment, the one or more low power inlet connectors 150 accordingly have a lower maximum current carrying capacity than the one or more higher power inlet connectors 160, in many examples by 10 percent or more.

In at least one embodiment, the one or more low power inlet connectors 150 have an ampacity of about 15 amps or less. In at least one embodiment, Ampacity, as that term is used herein, is defined as the maximum current, in amperes, that a conductor can carry continuously under the conditions of use without exceeding its temperature rating (e.g., maximum pin temperature), as calculated by the National Electric Code. In at least one embodiment, such as the embodiment of FIG. 1, the one or more low power inlet connectors 150 are one or more C13 inlet connectors. In at least one embodiment, for example in the United States, C13 inlet connectors have an ampacity of about 15 amps, for a 70 degrees Celsius maximum pin temperature (e.g., 120V×60 Hz). In at least one embodiment, for example in APAC or EU, C13 inlet connectors have an ampacity of about 10 amps, for a 70 degrees Celsius maximum pin temperature (e.g., 230V×50 Hz). In at least one embodiment, the one or more C13 inlet connectors are configured to couple to or engage with an electrical power cord having a C14 end, both of which may commonly be found associated with personal computers and related peripherals.

In at least one embodiment, the one or more higher power inlet connectors 160 have an ampacity of at least about 20 amps. In at least one embodiment, such as the embodiment of FIG. 1, the one or more higher power inlet connectors 160 are one or more C19 inlet connectors. In at least one embodiment, such as in the United States, C19 inlet connectors have an ampacity of about 20 amps, for a 70 degrees Celsius maximum pin temperature (e.g., 120V×60 Hz). In at least one embodiment, such as in APAC or EU, C19 inlet connectors have an ampacity of about 16 amps, for a 70 degrees Celsius maximum pin temperature (e.g., 230V×50 Hz). In at least one embodiment, the one or more C19 inlet connectors are configured to couple to or engage with an electrical power cord having a C20 end. In at least one embodiment, C19 inlet connectors and C20 ends are common for supplying power to enterprise-class servers, uninterruptable power supplies (UPS), datacenter rack-mounted power-distribution units and other equipment that draw too much current for C13/C14 types.

In at least one embodiment, an exact number of low power inlet connectors 150 and higher power inlet connectors 160 is based upon the power demand placed upon the power distribution unit 100 designed, manufactured and operated according to the disclosure. In at least one embodiment, in contrast to existing power distribution units, the power distribution unit 100 is designed such that a ratio of a number of the one or more higher power inlet connectors 160 to a number of the one or more low power inlet connectors 150 is at least 1:1. In at least one embodiment, if there is only one low power inlet connector 150, there will also be at least one higher power inlet connector 160. In at least one embodiment, if there are only two low power inlet connectors 150, there will similarly be at least two higher power inlet connectors 160.

In at least one embodiment, the number of higher power inlet connectors 160 greatly outweighs the number of low power inlet connectors 150. In at least one embodiment, for instance, the ratio of the number of the one or more higher power inlet connectors 160 to the number of the one or more low power inlet connectors 150 is at least 3:2. In at least one embodiment, the ratio of the number of the one or more higher power inlet connectors 160 to the number of the one or more low power inlet connectors 150 is at least 2:1. In at least one embodiment, the ratio of the number of the one or more higher power inlet connectors 160 to the number of the one or more low power inlet connectors 150 is at least 3:1, or even 7:1 or greater. In at least one embodiment, such as that illustrated in FIG. 1, the power distribution unit 100 includes twelve (12) higher power inlet connectors 160 (e.g., C19 inlet connectors) and six (6) low power inlet connectors 150 (e.g., C13 inlet connectors), again within a 2 U height (h) of the power distribution unit enclosure 110.

In at least one embodiment, the one or more low power inlet connectors 150 and one or more higher power inlet connectors 160 that extend through the connector surface 120 collectively have a load power capacity of at least about 17.3 kVA. In at least one embodiment, the phrase "load power capacity," as used throughout this disclosure, refers to 80% of the maximum amount of power the power distribution unit 100 is capable of supporting, which is a value chosen in North America in an attempt to avoid circuit overload and fire risk. In at least one embodiment, a load power capacity of at least about 17.3 kVA, would in turn represent a maximum power capacity of at least about 21.6 kVA at 60 amps.

In at least one embodiment, the one or more low power inlet connectors 150 and one or more higher power inlet connectors 160 that extend through the connector surface 120 collectively have a load power capacity of at least about 23 kVA (e.g., a maximum power capacity of at least about 28.8 kVA at 80 amps), and in yet another embodiment of at least about 28.8 kVA (e.g., a maximum power capacity of at least about 36 kVA at 100 amps). In at least one embodiment, the one or more low power inlet connectors 150 and one or more higher power inlet connectors 160 that extend through the connector surface 120 collectively have a load power capacity of at least about 34.5 kVA (e.g., a maximum power capacity of at least about 43 kVA at 60 amps), and in yet another different embodiment of at least about 57.5 kVA (e.g., a maximum power capacity of at least about 71.8 kVA at 100 amps). In at least one embodiment, a power distribution unit 100 designed, manufactured and operated according to the disclosure desirably employs the most number of higher power inlet connectors 160 having the highest load power capacity within the smallest power distribution unit enclosure 110.

In at least one embodiment, the power distribution unit 100 additionally includes a main power interface 170. In at least one embodiment, the main power interface 170 is the point at which the power distribution unit 100 receives AC power from a power source. In at least one embodiment, the main power interface 170 is coupled to a bus bar of a server rack system, for example using a main power cable. In at least one embodiment, such as that illustrated in FIG. 1, the main power interface 170 is on the right hand side of the back of the power distribution unit 100 (e.g., as looking at a back thereof). In at least one embodiment, the main power interface 170 may be located on the left hand side of the back of the power distribution unit 100 (e.g., as looking at a back thereof), or alternatively the power distribution unit 100 may have the option of placing the main power interface 170 on the right or left hand side thereof. In at least one embodiment, it may be beneficial to employ a right hand side main power interface 170 on a first power distribution unit 100 located within a server rack, and a left hand side main power interface 170 on a second power distribution unit 100 located within the server rack, as doing such helps physically manage the routing of power.

In at least one embodiment, in addition to the power distribution unit 100 distributing power amongst its one or more low power inlet connectors 150 and its one or more higher power inlet connectors 160, the power distribution unit 100 may have a transformer to step down the power for certain other lower power devices. In at least one embodiment, the power distribution unit 100 may additionally have metering capabilities, including both input and output metering capabilities. In at least one embodiment, the power distribution unit 100 may additionally be a managed power distribution unit, such that a user may remotely manage its features, including inlet connector switching, and inlet connector level controlling and monitoring, among other remotely managed features.

Figure 2:
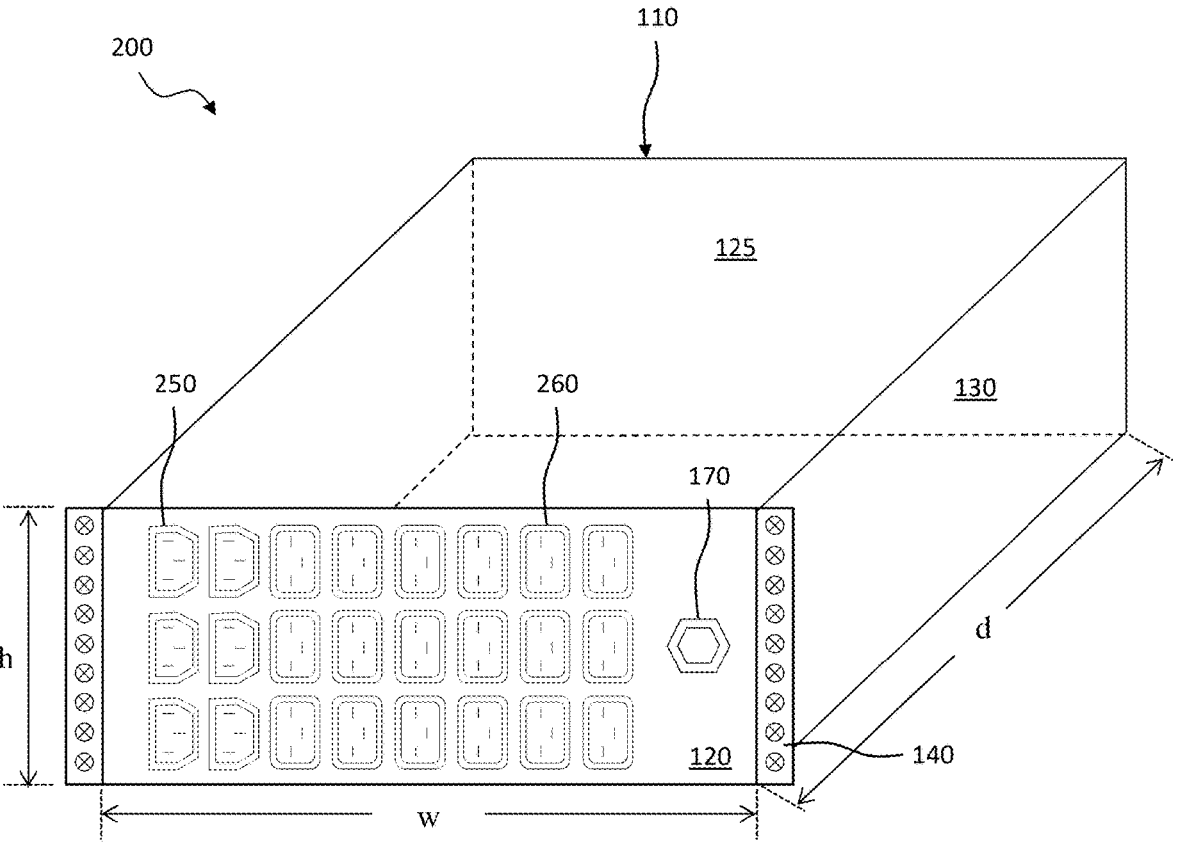

In at least one embodiment, FIG. 2 illustrates a power distribution unit 200 designed, manufactured and operated according to the disclosure. In at least one embodiment, the power distribution unit 200 is similar in many respects to the power distribution unit 100 described in detail above. In at least one embodiment, like reference numbers have been used to represent similar, if not identical, features. In at least one embodiment, the power distribution unit 200 differs, for the most part, from the power distribution unit 100, in that the power distribution unit 200 has a height (h) of 3 U, and furthermore includes six (6) low power inlet connectors 250 and eighteen (18) higher power inlet connectors 260 extending through the connector surface 120. In at least one embodiment, such as the embodiment of FIG. 2, the power distribution unit 200 has a load power capacity of at least about 34.5 kVA.

In at least one embodiment, FIG. 3 illustrates a power distribution unit 300 designed, manufactured and operated according to the disclosure. In at least one embodiment, the power distribution unit 300 is similar in many respects to the power distribution units 100, 200 described in detail above. In at least one embodiment, like reference numbers have been used to represent similar, if not identical, features. In at least one embodiment, the power distribution unit 300 differs, for the most part, from the power distribution units 100, 200, in that the power distribution unit 300 includes one or more higher power inlet connectors 360 extending through the connector surface 120, but does not include any low power inlet connectors extending through the connector surface. In at least one embodiment, the higher power inlet connectors 360 collectively have a load power capacity of at least about 17.3 kVA, if not at least about 34.5 kVA.

In at least one embodiment, the power distribution unit 300 additionally differs from the power distribution units 100, 200 in that it includes twenty-four (24) higher power inlet connectors 360 extending through the connector surface 120. In at least one embodiment, including the embodiment of FIG. 3, each of the one or more higher power inlet connectors 360 may have a maximum current carrying capacity of at least about 16 amps, such is the case if the higher power inlet connectors 360 were C19 inlet connectors.

In at least one embodiment, collections of different higher power inlet connectors 360 may be individually labeled, for example to align with different phases of the power. In at least one embodiment, the collection 370a might be color coded for a first phase of power, while collection 370b might be color coded for a second phase of power, and collection 370c might be color coded for a third phase of power. In at least one embodiment, the first collection 370a might be color coded red to indicate the first phase, the second collection 370b might be color coded black to indicate the second phase, and the third collection 370c might be color coded green to indicate the third phase. In at least one embodiment, the color coding may be applied using paint, stickers, or another readily visible indicator, and may be used with any power distribution unit manufactured according to the disclosure.

In at least one embodiment, FIG. 4 illustrates a power distribution unit 400 designed, manufactured and operated according to the disclosure. In at least one embodiment, the power distribution unit 400 is similar in many respects to the power distribution unit 100 described in detail above. In at least one embodiment, like reference numbers have been used to represent similar, if not identical, features. In at least one embodiment, the power distribution unit 400 differs, for the most part, from the power distribution unit 100, in that the power distribution unit 400 is a strip mounted power distribution unit, as opposed to the rack mounted power distribution units discussed above.

In at least one embodiment, the power distribution unit 400 includes a height (h), width (w), and depth (d), however, in at least one embodiment (e.g., in contrast to the power distribution unit 100), the width (w) of the power distribution unit 400 is significantly less than its height (h), and in many instances less than its depth (d). In at least one embodiment, including the illustrated embodiment of FIG.

4, the depth (d) of the power distribution unit 400 is greater than its width (w). In at least one embodiment, the depth (d) of the power distribution unit 400 is at least about two times its width (w). In at least one embodiment, the depth (d) of the power distribution unit 400 is at least about three times its width (w). In at least one embodiment, the larger depth (d) of the power distribution unit 400 may be necessary to accommodate larger load power capacities, such as values of at least about 17.3 kVA, if not at least about 34.5 kVA.

In at least one embodiment, the power distribution unit 400 furthermore includes six (6) low power inlet connectors 450 and twelve (12) higher power inlet connectors 460 extending through the connector surface 120. In at least one embodiment, including the illustrated embodiment of FIG. 4, the low power inlet connectors 450 are C13 connectors, and the higher power inlet connectors 460 are C19 connectors. In at least one embodiment, the low power inlet connectors 450 and higher power inlet connectors 460 are aligned in a single column, as opposed to the multiple columns achievable in the power distribution units 100, 200, 300. In at least one embodiment, the power distribution unit 400 has a load power capacity of at least about 17.3 kVA.

In at least one embodiment, FIG. 5 illustrates a server system 500 designed, manufactured and operated according to the present disclosure. In at least one embodiment, the server system 500 includes a server rack system 510. In at least one embodiment, the server rack system 510 may be a standard Electronic Industries Alliance (EIA) server rack system, among others, and remain within the purview of the disclosure. In at least one embodiment, the server rack system 510 includes an enclosure 520, a rail system 525 located within the enclosure 520, and an optional door 530.

In at least one embodiment, the server rack system 510 has a rack width ($w_r$), a rack height ($h_r$) and a rack depth ($d_r$) (not illustrated), which may be defined by the rail system 525. In at least one embodiment, while not limited to such, the server rack system 510 employs a width ($w_r$) of either approximately 483 mm (e.g., approximately 19 inches) or approximately 584 mm (e.g., approximately 23 inches). In at least one embodiment, the server rack system 510 employs a height ($h_r$) of approximately 1246 mm (e.g., 28 U—approximately 49 inches), approximately 1778 mm (e.g., 40 U—approximately 70 inches), approximately 1867 mm (e.g., 42 U—approximately 73.5 inches), approximately 2000 mm (e.g., 45 U—approximately 78.75 inches), or approximately 2134 mm (e.g., 48 U—approximately 84 inches). In at least one embodiment, the rack height ($h_r$) is at least twenty-eight rack units (28 U), and the rack width ($w_r$) is at least approximately 480 mm. In at least one embodiment, the depth ($d_r$) of the server rack system often varies, for example depending on the equipment that will be housed within the server rack system 510.

In at least one embodiment, including the embodiment of FIG. 5, one or more power distribution units 540 are physically coupled to the server rack system 510. In at least one embodiment, a first power distribution unit 540a and a second power distribution unit 540b are physically coupled to the server rack system 510. In at least one embodiment, such as the embodiment of FIG. 5, the power distribution units 540a, 540b are fixed within the rail system 525 using one or more fasteners 528. In at least one embodiment, the power distribution units 540a, 540b may be any power distribution unit designed, manufactured and operated according to the present disclosure. In at least one embodiment, the power distribution units 540a, 540b are similar, if not identical, to one or the other of the power distribution units 100, 200, 300 illustrated above with regard to FIGS.

1-3. In at least one embodiment, the power distribution units 540a, 540b would each include a power distribution unit enclosure having a connector surface, one or more low power inlet connectors extending through the connector surface, and one or more higher power inlet connectors extending through the connector surface, as described above. In at least one embodiment, a ratio of the number of the one or more higher power inlet connectors to the number of the one or more low power inlet connectors for each of the power distribution units 540a, 540b is at least 1:1. In at least one embodiment, the one or more low power inlet connectors and one or more higher power inlet connectors, for each of the power distribution units 540a, 540b, may collectively have a load power capacity of at least about 17.3 kVA.

In at least one embodiment, the power distribution units 540a, 540b are coupled to a main power source 550 using one or more main power cables 555, which may each in turn employ an IED 60309 plug at an end of the main power cable 555 opposite the power distribution units 540a, 540b. In at least one embodiment, the main power source 550 is a bus bar located within the enclosure 520. In at least one embodiment, the main power source 550 comprises a different feature than a bus bar. In at least one embodiment, the main power cables 555 extend between the main power source 550 and a main power interface of the power distribution units 540a, 540b.

In at least one embodiment, the power distribution units 540a, 540b are positioned within about 25 percent of a vertical midpoint (e.g., as defined by a midpoint of height ($h_r$)) of the rail system 525. In at least one embodiment, the power distribution units 540a, 540b are positioned within about 10 percent of the vertical midpoint of the rail system 525, and in even yet at least one other embodiment within about 5 percent of the vertical midpoint of the rail system 525. In at least one embodiment, such a position may allow the power distribution units 540a, 540b to be substantially equal distance from any electronics above and below them in the rail system 525.

In at least one embodiment, the server system 500 additionally includes a first data server 560a and a second data server 560b physically coupled to the server rack system 510. In at least one embodiment, one or both of the first and second data servers 560a, 560b may be CPU data servers. In at least one embodiment, one or both of the first and second data servers 560a, 560b may be GPU data servers. In at least one embodiment, one or both of the first and second data servers 560a, 560b may be data servers that include other types of processors, including application-specific integrated circuits (ASICs), digital signal processors (DSPs), or programmable logic devices such as programmable array logic (PAL), generic array logic (GAL), field programmable gate arrays (FPGA), or another type of computer processing device (CPD). In at least one embodiment, the first and second data servers 560a, 560b, may be a collection of CPU, GPU, and other data servers including the aforementioned processors. In at least one embodiment, one or both of the first and second data servers 560a, 560b may be GPU data servers from the DGX product line from NVIDIA. In at least one embodiment, including the illustrated embodiment of FIG. 5, both the first and second data servers 560a, 560b are DGX-2 GPU data servers, as might be obtained from NVIDIA. In at least one embodiment, unless otherwise indicated, the present disclosure should not be limited to CPU or GPU data servers, and moreover should not be limited to any specific manufacturer thereof.

In at least one embodiment, including in the embodiment of FIG. 5, the first and second data servers 560a, 560b are fixed within the rail system 525 using the one or more fasteners 528. In at least one embodiment, the first and second data servers 560a, 560b are additionally electrically coupled to the power distribution units 540a, 540b. In at least one embodiment, one or more server power cords 570 couple higher power inlet connectors of the power distribution units 540a, 540b to higher power inlet connectors of the first and second data servers 560a, 560b.

In at least one embodiment, the server system 500 additionally includes a low power peripheral device 580 physically coupled to the server rack system 510. In at least one embodiment, the low power peripheral device is fixed within the rail system 525 using the one or more fasteners 528. In at least one embodiment, the low power peripheral device 580 is additionally electrically coupled to one or more of the power distribution units 540a, 540b. In at least one embodiment, a power cord 590 couples a low power inlet connector of the power distribution unit 540a to a low power inlet connector of the low power peripheral device 580. In at least one embodiment, the low power peripheral device 580 may comprise many different devices and remain within the scope of the disclosure. In at least one embodiment, the low power peripheral device 580 is a low power cooling device.

In at least one embodiment, power distribution units, such as the power distribution units 540a, 540b, are particularly advantageous when used in a server rack system 510 along with one or more data servers. In at least one embodiment, such a design reduces the overall airflow impedance of the server system 500, and thus provides improved cooling characteristics. In at least one embodiment, the rack mount power distribution units 540a, 540b, in contrast to strip mounted power distribution units, additionally allow the power supplies 572 of the first and second data servers 560a, 560b to be easily replaced, for example by sliding them out of the first and second data servers 560a, 560b while the first and second data servers 560a, 560b remain fixed within the rail system 525. In at least one embodiment, for instance in at least one typical strip mounted power distribution unit design, the strip mounted power distribution unit substantially impedes the removal of the power supplies 572, whereas the rack mount power distribution units 540a, 540b do not.

In at least one embodiment, FIG. 6 illustrates a server system 600 designed, manufactured and operated according to the disclosure. In at least one embodiment, the server system 600 is similar in many respects to the server system 500 described in detail above. In at least one embodiment, like reference numbers have been used to represent similar, if not identical, features. In at least one embodiment, the server system 600 differs from the server system 500, in that the server system 600 employs a strip mounted power distribution unit 640, as opposed to the rack mounted power distribution units 540a, 540b discussed above. In at least one embodiment, the strip mounted power distribution unit 640 may be similar, in certain respects, to the strip mounted power distribution unit 400 discussed above with regard to FIG. 4, and thus may be a zero U power distribution unit.

In at least one embodiment, those skilled in the art to which this application relates will appreciate that other and further additions, deletions, substitutions and modifications may be made to the described embodiments.

The invention claimed is:

1. A power distribution unit, comprising:
a power distribution unit enclosure having a connector surface;
one or more low power inlet connectors extending through the connector surface;

one or more higher power inlet connectors extending through the connector surface, wherein a ratio of a number of the one or more higher power inlet connectors to a number of the one or more low power inlet connectors is at least 1:1; and
one or more main power cables coupled to the power distribution unit enclosure, a single one of the one or more main power cables simultaneously coupled to both of the one or more low power inlet connectors and the one or more higher power inlet connectors to provide power thereto.

2. The power distribution unit as recited in claim 1, wherein the one or more low power inlet connectors and one or more higher power inlet connectors collectively have a load power capacity of at least about 17.3 kVA.

3. The power distribution unit as recited in claim 1, wherein the one or more low power inlet connectors and one or more higher power inlet connectors collectively have a load power capacity of at least about 28.8 kVA.

4. The power distribution unit as recited in claim 1, wherein the one or more low power inlet connectors and one or more higher power inlet connectors collectively have a load power capacity of at least about 34.5 kVA.

5. The power distribution unit as recited in claim 1, wherein the one or more low power inlet connectors and one or more higher power inlet connectors collectively have a load power capacity of at least about 57.5 kVA.

6. The power distribution unit as recited in claim 1, wherein the ratio of the number of the one or more higher power inlet connectors to the number of the one or more low power inlet connectors is at least 3:2.

7. The power distribution unit as recited in claim 1, wherein the ratio of the number of the one or more higher power inlet connectors to the number of the one or more low power inlet connectors is at least 3:1.

8. The power distribution unit as recited in claim 1, wherein the power distribution unit enclosure is a rack mount power distribution unit enclosure.

9. The power distribution unit as recited in claim 8, further including rack mount ears coupled to the rack mount power distribution unit enclosure, the rack mount ears configured to fix the power distribution unit to a server rack system.

10. The power distribution unit as recited in claim 8, wherein the power distribution unit enclosure has a width (w) and height (h) that define the connector surface, and a depth (d), and further wherein the width (w) and depth (d) are greater than the height (h).

11. The power distribution unit as recited in claim 1, wherein each of the one or more higher power inlet connectors have an ampacity of at least about 20 amps.

12. The power distribution unit as recited in claim 11, wherein the one or more higher power inlet connectors are one or more C19 inlet connectors.

13. The power distribution unit as recited in claim 11, wherein each of the one or more low power inlet connectors have an ampacity of about 15 amps or less.

14. The power distribution unit as recited in claim 13, wherein the one or more low power inlet connectors are one or more C13 inlet connectors.

15. The power distribution unit as recited in claim 1, wherein at least twelve (12) higher power inlet connectors extend through the connector surface.

16. The power distribution unit as recited in claim 15, wherein the power distribution unit enclosure has a width (w) and height (h) that define the connector surface, and further wherein the height (h) is 2 rack units (2 U).

17. The power distribution unit as recited in claim 1, wherein at least eighteen (18) higher power inlet connectors extend through the connector surface.

18. The power distribution unit as recited in claim 17, wherein the power distribution unit enclosure has a width (w) and height (h) that define the connector surface, and further wherein the height (h) is 3 rack units (3 U).

19. A server system, comprising:

a server rack system, the server rack system having a rack height ($h_r$) and a rack width ($w_r$);

a power distribution unit physically coupled to the server rack system, the power distribution unit including;

a power distribution unit enclosure having a connector surface;

one or more low power inlet connectors extending through the connector surface;

one or more higher power inlet connectors extending through the connector surface, wherein a ratio of a number of the one or more higher power inlet connectors to a number of the one or more low power inlet connectors is at least 1:1;

one or more main power cables coupled to the power distribution unit enclosure, a single one of the one or more main power cables simultaneously coupled to both of the one or more low power inlet connectors and the one or more higher power inlet connectors to provide power thereto; and a data server physically coupled to the server rack system and electrically coupled to the power distribution unit.

20. The server system as recited in claim 19, wherein the data server is a first data server, and further including a second data server physically coupled to the server rack system and electrically coupled to a second power distribution unit physically coupled to the server rack system.

21. The server system as recited in claim 20, wherein the first data server is a first GPU data server and the second data server is a second GPU data server.

22. The server system as recited in claim 19, wherein the one or more low power inlet connectors and one or more higher power inlet connectors collectively have a load power capacity of at least about 17.3 kVA.

23. The server system as recited in claim 19, wherein the one or more low power inlet connectors and one or more higher power inlet connectors collectively have a load power capacity of at least about 28.8 kVA.

24. The server system as recited in claim 19, wherein the one or more low power inlet connectors and one or more higher power inlet connectors collectively have a load power capacity of at least about 34.5 kVA.

25. The server system as recited in claim 19, wherein the one or more low power inlet connectors and one or more higher power inlet connectors collectively have a load power capacity of at least about 57.5 kVA.

26. The server system as recited in claim 19, wherein the ratio of the number of the one or more higher power inlet connectors to the number of the one or more low power inlet connectors is at least 3:2.

27. The server system as recited in claim 19, wherein the ratio of the number of the one or more higher power inlet connectors to the number of the one or more low power inlet connectors is at least 3:1.

28. The server system as recited in claim 19, wherein the power distribution unit enclosure is a rack mount power distribution unit enclosure.

29. The server system as recited in claim 28, further including rack mount ears coupled to the rack mount power distribution unit enclosure, the rack mount ears configured to fix the power distribution unit to the server rack system.

30. The server system as recited in claim 28, wherein the power distribution unit enclosure has a width (w) and height (h) that define the connector surface, and a depth (d), and further wherein the width (w) and depth (d) are greater than the height (h).

31. The server system as recited in claim 19, wherein each of the one or more higher power inlet connectors have an ampacity of at least about 20 amps.

32. The server system as recited in claim 31, wherein the one or more higher power inlet connectors are one or more C19 inlet connectors.

33. The server system as recited in claim 31, wherein each of the one or more low power inlet connectors have an ampacity of less than about 15 amps.

34. The server system as recited in claim 33, wherein the one or more low power inlet connectors are one or more C13 inlet connectors.

35. The server system as recited in claim 19, wherein at least twelve (12) higher power inlet connectors extend through the connector surface.

36. The server system as recited in claim 35, wherein the power distribution unit enclosure has a width (w) and height (h) that define the connector surface, and further wherein the height (h) is 2 rack units (2 U).

37. The server system as recited in claim 19, wherein at least eighteen (18) higher power inlet connectors extend through the connector surface.

38. The server system as recited in claim 37, wherein the power distribution unit enclosure has a width (w) and height (h) that define the connector surface, and further wherein the height (h) is 3 rack units (3 U).

39. The server system as recited in claim 19, wherein the rack height ($h_r$) is at least twenty-eight rack units (28 U), and the rack width ($w_r$) is at least approximately 480 mm.

40. The power distribution unit as recited in claim 1, wherein the one or more low power inlet connectors and the one or more higher power inlet connectors are configured to provide a same output voltage.

41. The server system as recited in claim 19, wherein the one or more low power inlet connectors and the one or more higher power inlet connectors are configured to provide a same output voltage.

42. The power distribution unit as recited in claim 1, wherein the one or more low power inlet connectors each includes three low power slots for receiving three prongs of a low power electrical cord, and the one or more higher power inlet connectors each includes three higher power slots for receiving three prongs of a higher power electrical cord.

43. The server system as recited in claim 19, wherein the one or more low power inlet connectors each includes three low power slots for receiving three prongs of a low power electrical cord, and the one or more higher power inlet connectors each includes three higher power slots for receiving three prongs of a higher power electrical cord.

* * * * *